United States Patent [19]

Kinoshita et al.

[11] Patent Number: 5,411,898
[45] Date of Patent: May 2, 1995

[54] METHOD OF MANUFACTURING A COMPLEMENTARY BIPOLAR TRANSISTOR

[75] Inventors: Yasushi Kinoshita; Kazuhito Niwano, both of Itami, Japan

[73] Assignee: Mitsubishi Denki Kabushiki Kaisha, Tokyo, Japan

[21] Appl. No.: 19,898

[22] Filed: Feb. 19, 1993

Related U.S. Application Data

[62] Division of Ser. No. 764,765, Sep. 24, 1991, Pat. No. 5,218,227.

[30] Foreign Application Priority Data

Mar. 13, 1991 [JP] Japan .................................. 3-47171

[51] Int. Cl.$^6$ .......................................... H01L 21/265
[52] U.S. Cl. ........................................ 437/31; 437/26; 437/64; 437/67; 148/DIG. 10
[58] Field of Search ................... 437/31, 26, 54, 55, 437/59, 63, 64, 67; 148/DIG. 10

[56] References Cited

U.S. PATENT DOCUMENTS

| | | | |
|---|---|---|---|
| 4,357,622 | 11/1982 | Magdo et al. | 437/63 |
| 4,835,115 | 5/1989 | Eklund | 437/67 |
| 4,897,363 | 1/1990 | Suda | 437/63 |
| 4,910,160 | 3/1990 | Jennings et al. | 437/31 |
| 4,940,671 | 7/1990 | Small et al. | 437/26 |
| 5,110,749 | 5/1992 | Ikeda | 437/26 |
| 5,175,607 | 12/1992 | Ikeda | 437/63 |

Primary Examiner—Tom Thomas
Assistant Examiner—Tuan Nguyen
Attorney, Agent, or Firm—Oblon, Spivak, McClelland, Maier & Neustadt

[57] ABSTRACT

An n type buried layer (2b) lying in the lower part of a PNP transistor (101a) is lower in impurity concentration than an n+ type buried layer (2a) lying in the lower part of an NPN transistor (100). A p+ type buried layer (4a) is formed thick on the n type buried layer (2b) and insulated from the n+ type buried layer (2a) by an isolation trench (7). A breakdown voltage at a junction of the p+ type buried layer (4a) and the n type buried layer (2b) can be improved and, accordingly, the breakdown voltage of the whole device being improved. Low-controlled collector resistance of the PNP transistor (101a) prevents an amplification factor from decreasing.

10 Claims, 12 Drawing Sheets

METHOD OF MANUFACTURING A COMPLEMENTARY BIPOLAR TRANSISTOR

This is a division, of application Ser. No. 07/764,765, filed on Sep. 24, 1991, now U.S. Pat. No. 5,218,227.

BACKGROUND OF THE INVENTION

1. Field of the Invention

The present invention relates to a semiconductor device and a method of manufacturing the same and more particularly to a complementary bipolar transistor including NPN and PNP transistors and a method of manufacturing the same.

2. Description of the Background Art

FIGS. 8 to 12 are sectional views of a conventional complementary bipolar transistor in Various stages of production.

Referring initially to FIG. 8, ion implantation of antimony (Sb+) is performed over a major surface of a p⁻ type semiconductor substrate 1. Heat treatment for diffusion of impurities (hereinafter referred to as "drive") and thermal oxidation are performed to form an n+ type buried layer 2 and an oxide film 3 (in FIG. 9). The oxide film 3 is selectively etched away by photolithography technique. Masked with the remaining oxide film 3, the n+ type buried layer 2 is doped with boron ions (B+) by a means of ion implantation (in FIG. 10). The drive is performed, and the oxide film 3 is entirely removed. A p+ type buried layer 4 and an n⁻ type epitaxially growth layer 5 are formed by means of epitaxial growth (in FIG. 11).

Isolation trenches 7 and p type channel cut layers 6 are formed, and thereafter a p⁻ type well layer 8, a p+ type collector wall layer 9, and an n+ type collector wall layer 10 are formed. Subsequently formed are a p type base 11a, an n type base 12a, an n+ type emitter layer 13, a potential extraction layer 30, a p+ type emitter layer 14, polycrystalline silicon films 15, an n+ type external base layer 12b, and a p+ type external base layer 11b. Silicide films 16, barrier metals 17, and aluminum electrodes 18 are provided, so that an NPN transistor 100 and a PNP transistor 101 are formed (in FIG. 12). The NPN transistor 100 comprises a collector electrode 19, an emitter electrode 20, and a base electrode 21. The PNP transistor 101 comprises a collector electrode 23, an emitter electrode 24, a base electrode 25, and a potential extraction electrode 22.

The conventional complementary bipolar transistor has been manufactured in this manner. FIG. 13 shows an equivalent circuit of the PNP transistor 101.

A PNP transistor 101b has an intrinsic function of the PNP transistor 101. The p⁻ type well layer 8 and p+ type buried layer 4, the n type base 12a, and the p+ type emitter layer 14 serve as collector, base, and emitter of the PNP transistor 101b, respectively. An NPN transistor 102 is formed parasitically on a PNP transistor 101. The n type base 12a, the p⁻ type well layer 8, and the n+ type buried layer 2 serve as emitter, base, and collector of the NPN transistor 102, respectively. A PNP transistor 103 is a parasitic transistor, wherein the p⁻ type semiconductor substrate 1, the n+ type buried layer 2, and the p+ type buried layer 4 serve as collector, base, and emitter, respectively. A resistor R1 is composed of the p+ type collector wall layer 9 and the p+ type buried layer 4. A resistor R2 is composed of the n⁻ type epitaxial growth layer 5 between the potential extraction electrode 22 and the n+ type buried layer 2. A resistor R3 is composed of the p⁻ type well layer 8 between the n type base layer 12a and the p+ type buried layer 4.

For operation of the NPN transistor 101 having such an equivalent circuit, in general, a potential extraction electrode TUB is set at a maximum potential by connecting to the emitter E of the transistor 101b, as shown by the broken lines of FIG. 13, to reduce the influence of the parasitic transistors 102 and 103. When a breakdown voltage $BV_{TCO}$ between the potential extraction electrode TUB and the collector C of the whole transistor 101 is lower than a breakdown voltage BVCEO between the collector C and the emitter E, breakdown occurs between the electrode TUB and the collector C before breakdown occurs between the collector C and the emitter E. A required breakdown voltage cannot be attained. The conventional complementary bipolar transistor, however, includes a PN junction composed of the p+ type buried layer 4 of high impurity concentration and the n+ type buried layer 2 of high impurity concentration. There has been a problem that the breakdown voltage of the transistor 103 having this PN junction and accordingly the breakdown voltage of the whole transistor 101 are low.

The p+ type buried layer 4 is formed by the ion implantation of boron (B+) in the n+ type buried layer 2 of high impurity concentration, and hence cannot grow very thick. Another problem is that a collector resistance cannot be reduced which is the sum of the resistance R1 and the resistance R3, and a large amount of collector current flow causes decrease in amplification factor $h_{FE}$.

SUMMARY OF THE INVENTION

According to the present invention, a semiconductor device comprises: a first conductivity type semiconductor substrate; a second conductivity type first buried layer of relatively low impurity concentration and of relatively large thickness and a second conductivity type second buried layer of relatively high impurity concentration and of relatively small thickness, the first and second buried layers being deposited complementarily to each other on one major surface of the substrate; a first conductivity type third buried layer formed on the first buried layer; a second conductivity type region formed on the first and third buried layers and on the second buried layer; an insulative trench extending from the surface of the second conductivity type region through to the vicinity of the substrate for dividing the second conductivity type region into a first active region including the third buried layer and a second active region other than the first active region; a first semiconductor device formed in the first active region; and a second semiconductor device formed in the second active region, the conductivity type of the second semiconductor device being inverse to that of the first semiconductor device.

The present invention is also directed to a method of manufacturing a semiconductor device. According to the present invention, the method comprises the steps of: selectively introducing impurities to one major surface of a first conductivity type semiconductor substrate to form a second conductivity type first buried layer of relatively low impurity concentration and of relatively large thickness; selectively introducing impurities to the one major surface to form a second conductivity type second buried layer of relatively high impurity concentration and of relatively small thickness, the second buried layer being deposited complementarily to the first buried layer on the one major surface; selectively introducing impurities onto the first buried layer to form a first conductivity type third buried layer; forming a second conductivity type region by epitaxial growth on the first and third buried layers and on the second buried layer; forming an insulative trench extending from the surface of the second conductivity type region through to the vicinity of the substrate for dividing the second conductivity type region into a first active region including the third buried layer and a second active region other than the first active region; forming a first semiconductor device in the first active region; and forming a second semiconductor device in the second active region, the conductivity type of the second semiconductor device being inverse to that of the first semiconductor device.

The first buried layer is formed, independent of the second buried layer, with low impurity concentration. Therefore, the breakdown voltage of the PN junction formed by the first and third buried layers, which are different from each other in conductivity type, can be higher than that of the PN junction in which the second buried layer is substituted for the first buried layer.

The third buried layer is formed by introducing impurities to thereby selectively inverting the conductivity type of the first buried layer. When the impurity concentration of the first buried layer is low, the third buried layer of small resistivity and of large thickness can be formed.

Since the element isolation is carried out by means of the insulative trench, the second buried layer can be formed in a self-aligned manner.

As described hereinabove, in the semiconductor device according to the present invention, the first buried layer lying in the lower part of the first semiconductor device is formed, severally and complementarily to the second buried layer lying in the lower part of the second semiconductor device. The impurity concentration of the first buried layer is lower than that of the second buried layer. The third buried layer formed on the first buried layer is different from the first buried layer in conductivity type. Therefore, the breakdown voltage of the PN junction formed by the first and third buried layers is higher than that of the PN junction in which the second buried layer is substituted for the first buried layer. This provides the first semiconductor device with a higher breakdown voltage.

The first buried layer is thicker than the second buried layer, and is low in impurity concentration. Accordingly, the third buried layer can be thick. The electrode resistance of the first semiconductor device is decreased, so that decrease in the amplification factor thereof is restrained.

In the method of manufacturing a semiconductor device according to the present invention, which provides the above-mentioned semiconductor device, the insulative trench isolates the second buried layer from the third buried layer. The second buried layer may be formed in contact with the first buried layer. No patterning mask is required for the formation of the second buried layer. The second buried layer is formed in a self-aligned manner.

An object of the present invention is to provide a semiconductor device capable of improving a breakdown voltage of a first semiconductor device and decreasing an electrode resistance thereof to thereby restrain decrease in an amplification factor.

These and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 2 to 7 are sectional views of a semiconductor device in various stages of production according to the present invention.

Initially, a thermal oxide film 3 of 500 Å in thickness and a nitride film 26 of 1000 Å in thickness are formed over a major surface of a p⁻ type semiconductor substrate 1. A photolithography process is performed by means of a photoresist to selectively remove the oxide film 3 and the nitride film 26. After the removal of the photoresist, ion implantation of phosphorus (P⁺) is performed, using the remaining oxide film 3 and nitride film 26 as a mask (in FIG. 2), at an acceleration voltage of 30 to 50 keV and at a dose of $2 \times 10^{13}$ to $1 \times 10^{14}$ cm⁻². When the acceleration voltage is 50 keV and the dose is $5 \times 10^{13}$ cm⁻², the ion implantation with a range center of 607 Å and a distribution of 256 Å is performed.

Figure 3:
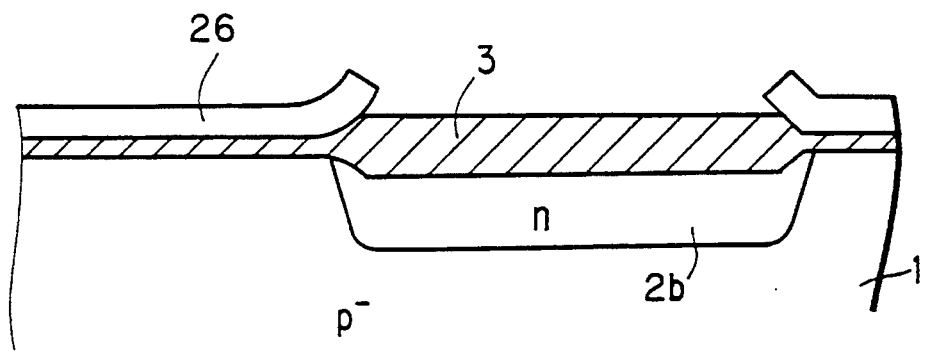
Figure 4:
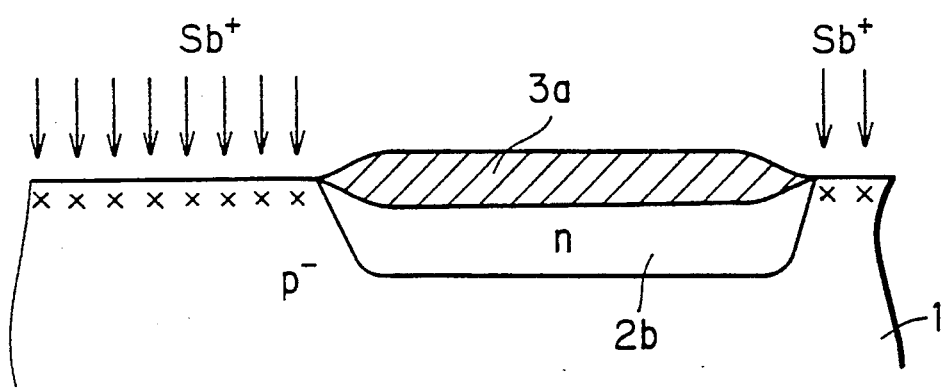
Figure 5:
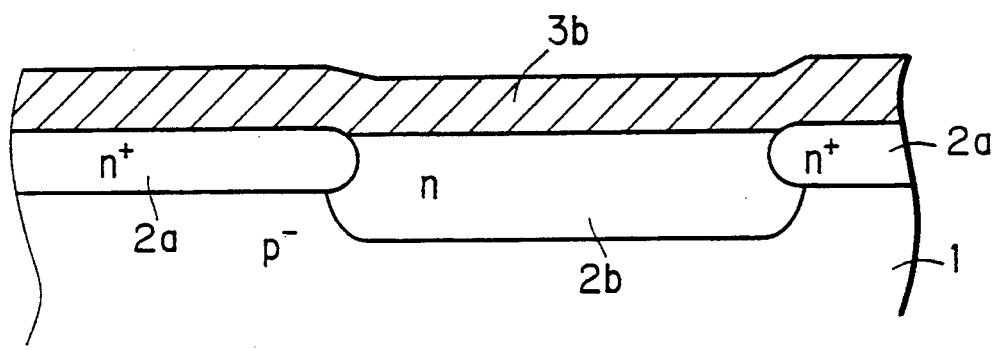

The substrate 1 is subjected to drive and thermal oxidation, so that an n type buried layer 2b is formed and the oxide film 3 grows thicker in the portion where the nitride film 26 has been removed (in FIG. 3). Preferably, the drive is required to be performed at a temperature of 1000° to 1200° C. for two to three hours, and the thermal oxidation is required to be performed at a temperature of 950° to 1100° C. for twenty to ninety minutes. For example, the n type buried layer 2b of 5 μm in thickness and of $2 \times 10^{16}$ cm⁻³ in impurity concentration is formed where the drive conditions are 1100° C. and two hours. The oxide film 3 can be increased in thickness up to about 3500 Å where the thermal oxidation conditions are 1100° C. and twenty minutes.

The nitride film 25 is removed. The entire surface of the oxide film is subjected to etching to provide an oxide film 3a remaining only in the portion where the thickness has been increased in the last step. Ion implantation of antimony (Sb⁺) is performed, using the oxide film 3a as a mask, that is, on the region where the n type buried layer 2b is absent (in FIG. 4), preferably at an acceleration voltage of about 50 keV and at a dose of $3 \times 10^{15}$ to $4 \times 10^{15}$ cm$^{-2}$. When the acceleration voltage is 50 keV and the dose is $3.6 \times 10^{15}$ cm$^{-2}$, the ion implantation with a range center of 271 Å and a distribution of 84 Å is performed.

An n+ type buried layer 2a and an oxide film 3b are formed by drive and thermal oxidation. For example, the n+ type buried layer 2a of 2 μm in thickness and of about $10^{19}$ cm$^{-3}$ in impurity concentration is formed where the drive conditions are 1100° C. and two hours. The oxide film 3b of about 3500 Å in thickness is formed where the thermal oxidation conditions are 1100° C. and twenty minutes (in FIG. 5).

Figure 6:
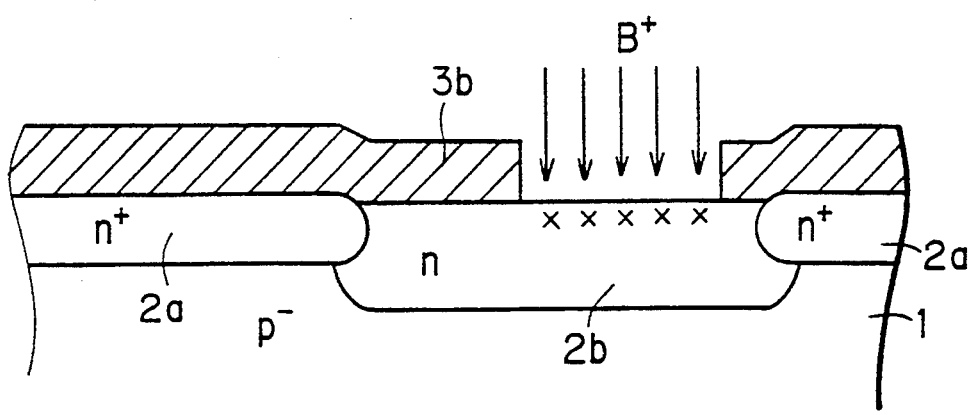
Figure 7:
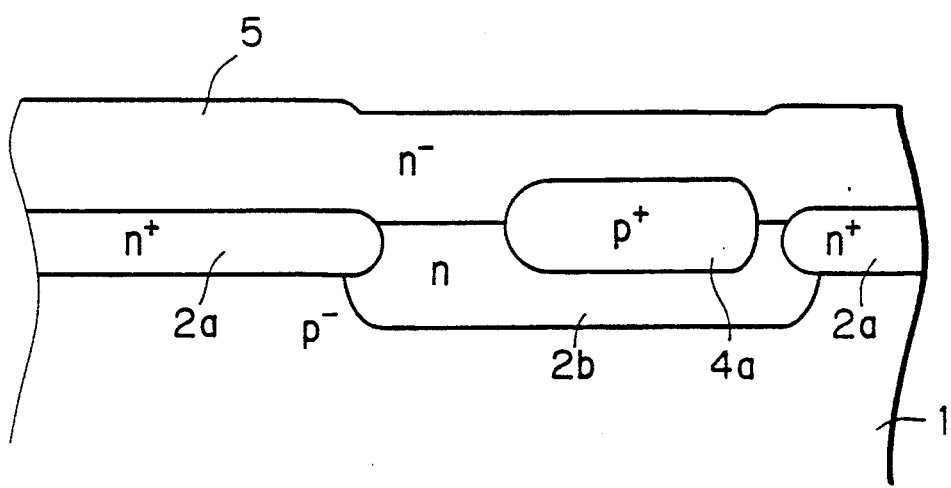
Figure 8:
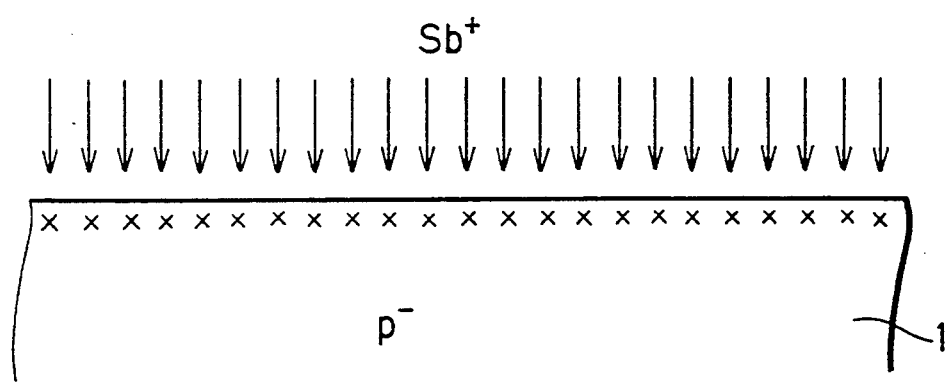
FIGS. 8 to 11 are sectional views illustrating various stages of a method of manufacturing a conventional semiconductor device.
Figure 9:
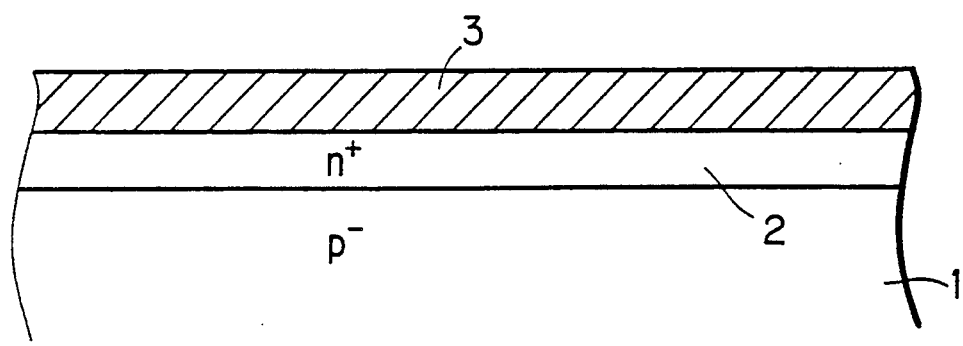
Figure 10:
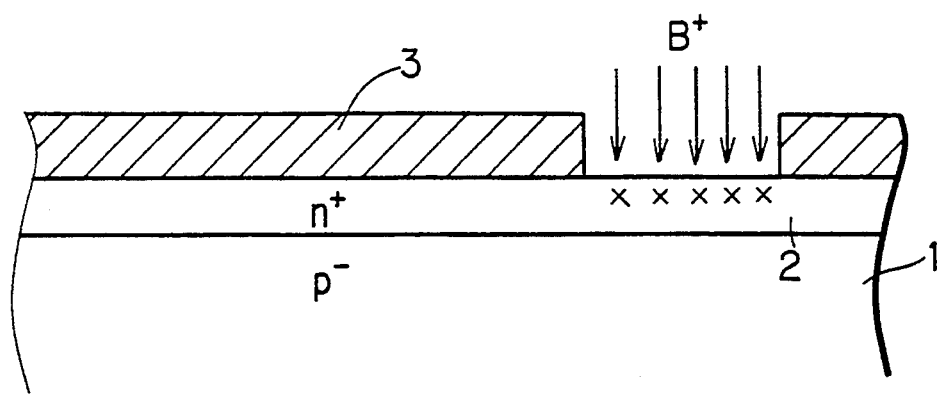
Figure 11:
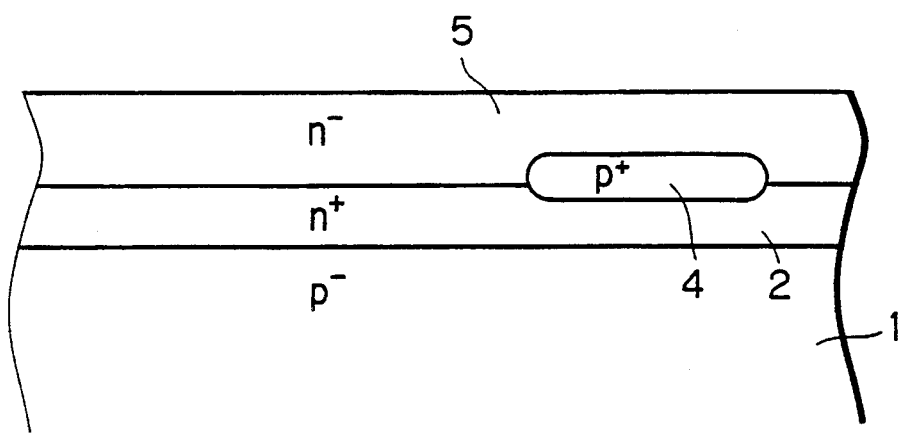
Figure 12:
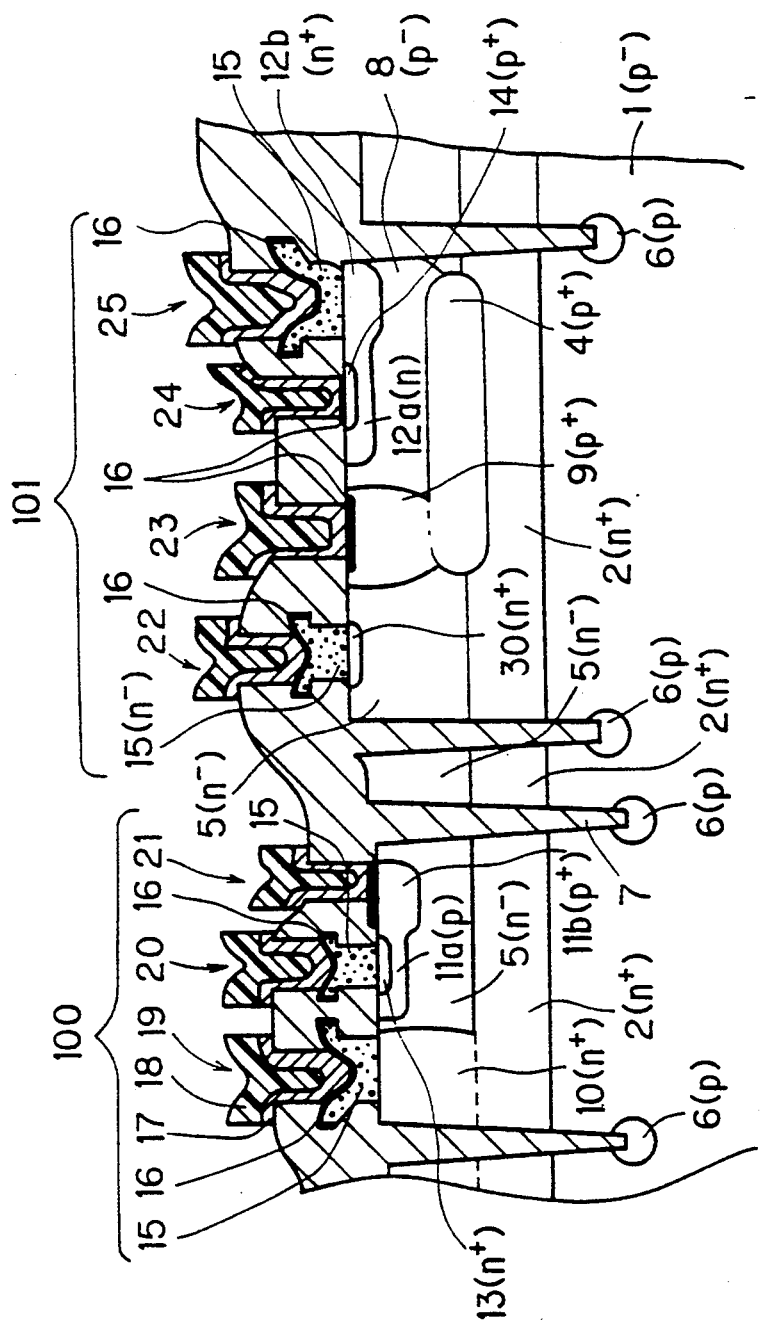
FIG. 12 is a sectional view of the conventional semiconductor device.

A photolithography process is performed by means of a photoresist to selectively remove the oxide film 3b and to expose part of the n type buried layer 2b. Masked with the remaining oxide film 3b, ion implantation of boron (B+) is performed, as shown in FIG. 6, at an acceleration voltage of 10 to 50 keV and at a dose of $1 \times 10^{15}$ cm$^{-2}$ or less to prevent crystal defect, normally of $1 \times 10^{14}$ to $8 \times 10^{14}$ cm$^{-2}$. When the acceleration voltage is 30 keV and the dose is $2 \times 10^{14}$ cm$^{-2}$, the ion implantation with a range center of 987 Å and a distribution of 371 Å is performed.

After the drive at a temperature of about 1000° C. for twenty to sixty minutes, the oxide film 3b is entirely removed. An n− type epitaxial growth layer 5 of about 3.5 μm in thickness is deposited by epitaxial growth. When the epitaxial growth is performed at a temperature of 950° to 1200° C. for fifteen to thirty minutes using SiCl$_4$ gas and PH$_3$ gas, for example, the resulting impurity concentration is $5 \times 10^{15}$ cm$^{-3}$. The aforesaid processes provide a p+ type buried layer 4a of 4.4 μm in thickness and of $10^{17}$ to $10^{18}$ cm$^{-3}$ in impurity concentration (in FIG. 7).

Figure 1:
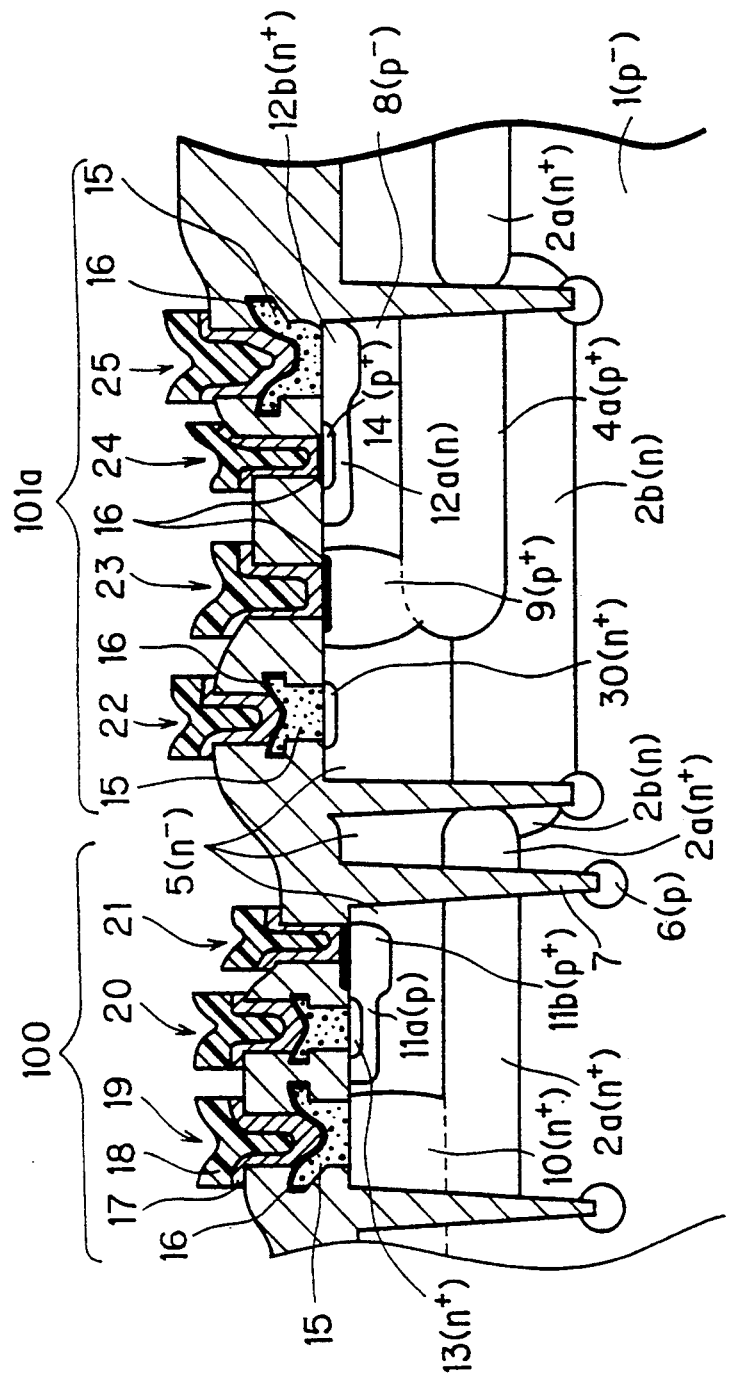
FIG. 1 is a sectional view of a semiconductor device according to a preferred embodiment of the present invention.
Figure 2:
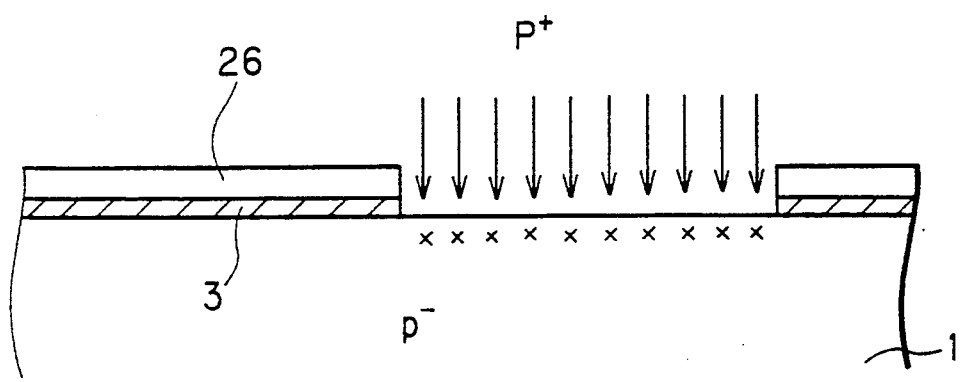
FIGS. 2 to 7 are sectional views illustrating various stages of a method of manufacturing the semiconductor device of FIG. 1.

As shown in FIG. 1, trenches extending from the surface of the n− type epitaxial growth layer 5 to the substrate 1 are formed. P type impurities are diffused from the bottom of the trenches, thereby p type channel cut layers 6 of about $10^{18}$ cm$^{-3}$ in impurity concentration being formed. The trenches are filled with oxide films to form isolation trenches 7. The oxide film on the top surface is once removed by etchback.

A p− type well layer 8 of about $10^{16}$ cm$^{-3}$ in impurity concentration is selectively formed in the n− type epitaxial growth layer 5 on the p+ type buried layer 4a by ion implantation and the like. A p+ type collector wall layer 9 of about $10^{19}$ cm$^{-3}$ in impurity concentration is selectively formed in the p− type well layer 8. Similarly, an n+ type collector wall layer 10 is selectively formed in the n− type epitaxial growth layer 5 on the n+ type buried layer 2a.

An n type intrinsic base 12a of about $10^{17}$ cm$^{-3}$ in impurity concentration is selectively formed in the surface of the p− type well layer 8 by ion implantation and the like. Similarly, a p type intrinsic base 11a is selectively formed above the n+ type buried layer 2a in the surface of the n− type epitaxial growth layer 5 apart from the n+ type collector wall layer 10.

By the ion implantation of the n type impurities and the like, an n+ type emitter layer 13 of about $10^{20}$ cm$^{-3}$ in impurity concentration is selectively formed in the surface of the p type base 11a, while a potential extraction layer 30 is selectively formed above the n type buried layer 2b in the surface of the n− type epitaxial growth layer 5 simultaneously. A p+ type emitter layer 14 of about $10^{19}$ cm$^{-3}$ in impurity concentration is selectively formed in the surface of the n type base 12a.

Subsequently, an oxide film is formed over the top surface. Openings are selectively provided in order to form external base layers and to extract electrodes in the following manner: An n+ type external base layer 12b of about $10^{20}$ cm$^{-3}$ in impurity concentration is formed in contact with the n type base 12a in the surface of the p− type well layer 8 by ion implantation and the like. Polycrystalline silicon films 15 are provided on the n+ type external base layer 12b and the potential extraction layer 30.

A p+ type external base layer 11b is similarly provided adjacent to the p type base layer 11a. Thereafter, silicide films 16 and barrier metals 17 are provided. On the p+ type external base layer 11b, the silicide film 16 is wider than the barrier metal 17 in order to reduce base resistance, such that it extends to the vicinity of the n+ type emitter layer 13. The detailed description is as follows: After the formation of the silicide film 16, the top surface is once covered with an oxide film. An opening for the barrier metal 17 in the oxide film is designed to be smaller than an opening for the silicide film 16. The silicide film 16 is similarly formed wider than the barrier metal 17 on the p+ type collector wall layer 9.

Aluminum electrodes 18 are provided on the silicide films 16 and barrier metals 17. Thus, attained are an NPN transistor 100 composed of a collector electrode 19, an emitter electrode 20 and a base electrode 21, and a PNP transistor 101a composed of a collector electrode 23, an emitter electrode 24, a base electrode 25 and a potential extraction electrode 22.

The PNP transistor 101a is different from the conventional PNP transistor 101 in the impurity concentration of the n type buried layer 2b. In the prior art, the n+ type buried layer 2 serving as collector of the NPN transistor 100 extends to the region of the PNP transistor 101, resulting in the problem of the breakdown voltage of the PN junction formed by the n+ type buried layer 2 and the p+ type buried layer 4. In the present invention, the provision of the n type buried layer 2b having the impurity concentration lower than the n+ type buried layer 2 in the lower part of the PNP transistor 101a solves the problem. This will be discussed in detail hereinafter.

In general, when one (p or n type) material of the PN junction is higher in impurity concentration than the other material thereof, the breakdown voltage at the junction is determined by the impurity concentration of the latter.

Figure 13:
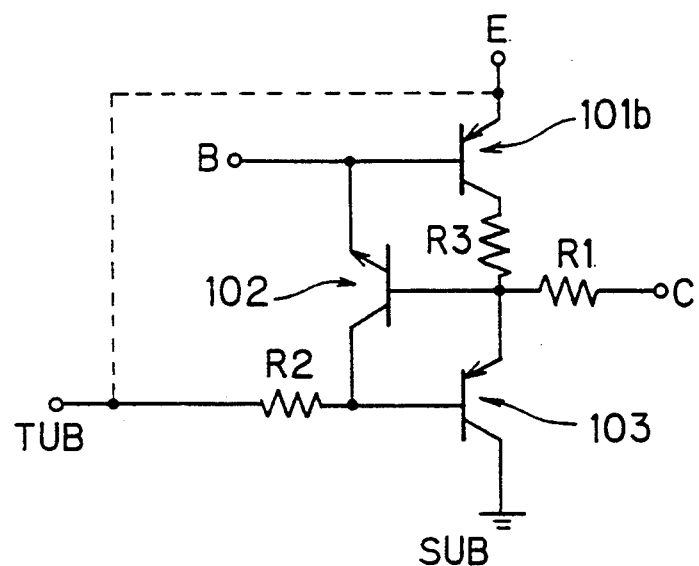
FIG. 13 illustrates an equivalent circuit of a PNP transistor in the semiconductor device of FIG. 12.
Figure 14:
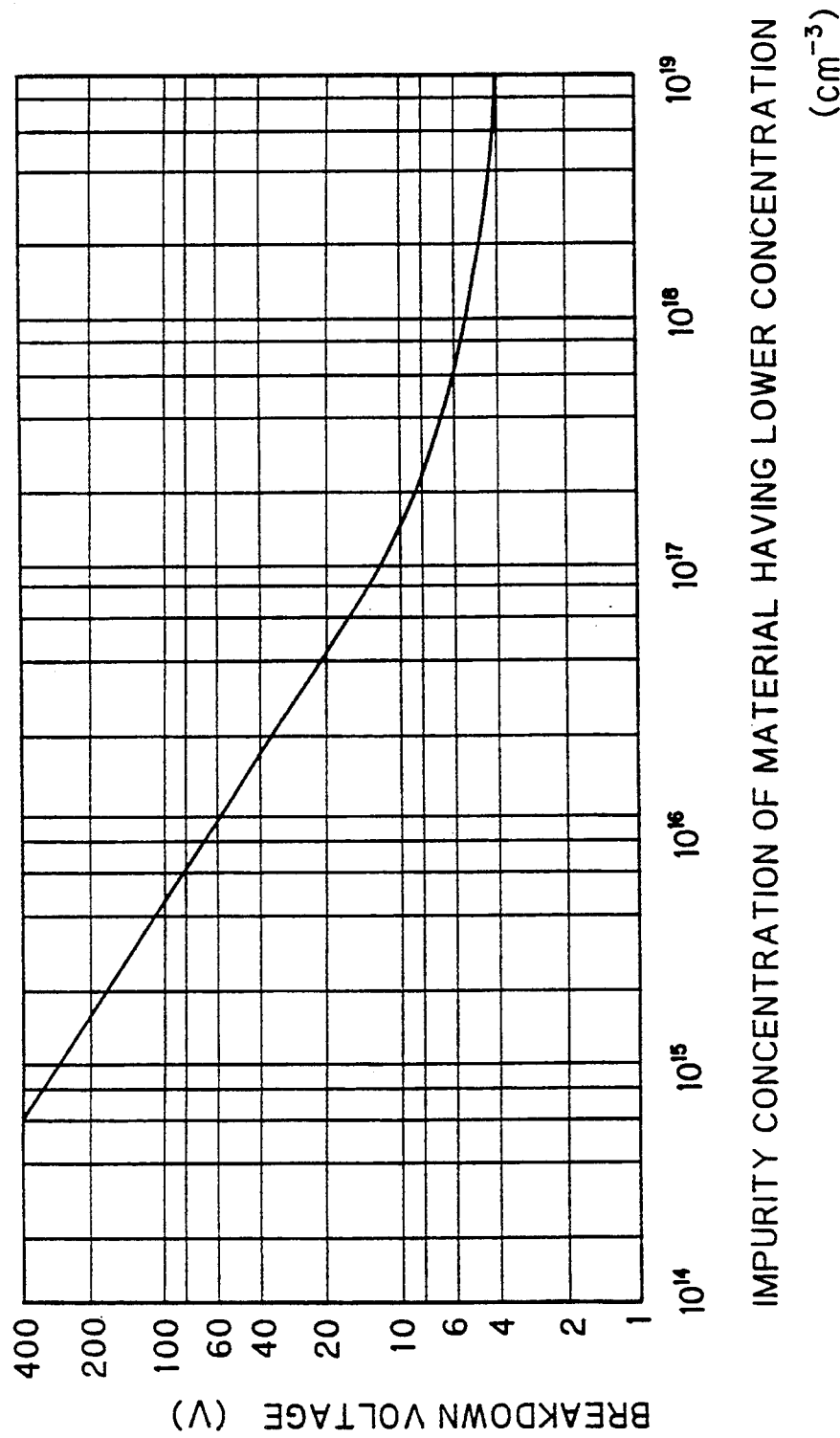
FIG. 14 is a graph showing characteristics of a breakdown voltage of a PN junction.

FIG. 14 shows this relation. In the prior art, the impurity concentrations of the n+ type buried layer 2 and the p+ type buried layer 4 are about $10^{19}$ cm$^{-3}$ and $2 \times 10^{17}$ cm$^{-3}$, respectively. The breakdown voltage of the PN junction is determined by the impurity concentration of the p+ type buried layer 4, resulting in about 8 V. Since the breakdown voltage BV$_{CEO}$ between the collector C and the emitter E is normally 12 V or mope, breakdown occurs between the electrode TUB and the collector C before breakdown occurs between the collector C and emitter E of FIG. 13.

In the present invention, the impurity concentrations of the n type buried layer 2b and the p+ type buried layer 4a are about $2 \times 10^{16}$ cm$^{-3}$ and $10^{19}$ cm$^{-3}$, respectively. The breakdown voltage of the PN junction is determined by the impurity concentration of the n type buried layer 2b. It will be apparent from FIG. 14 that the breakdown voltage is more than 20 V, according to the present invention. Thus, the breakdown voltage $BV_{TC}$ between the potential extraction electrode TUB and the collector C can be improved.

The collector resistance of the PNP transistor 101a in the present invention is smaller than that of the PNP transistor 101 in the prior art (1 k$\Omega$ or more). The reason is as follows: Since the n type buried layer 2b which is base material for forming the p+ type buried layer 4a is lower in impurity concentration than the n+ type buried layer 2, the inversion of the conductivity type by the ion implantation of boron (B+) is easily generated. The impurity concentration of the p+ type buried layer 4 is increased, and accordingly the resistivity thereof is decreased. In addition, the p+ type buried layer 4 grows thick. As a result, the resistance $R_1$ shown in FIG. 13 is decreased.

Hereinafter described is an improvement in transistor characteristics by the decreased collector resistance in detail.

Figure 15:
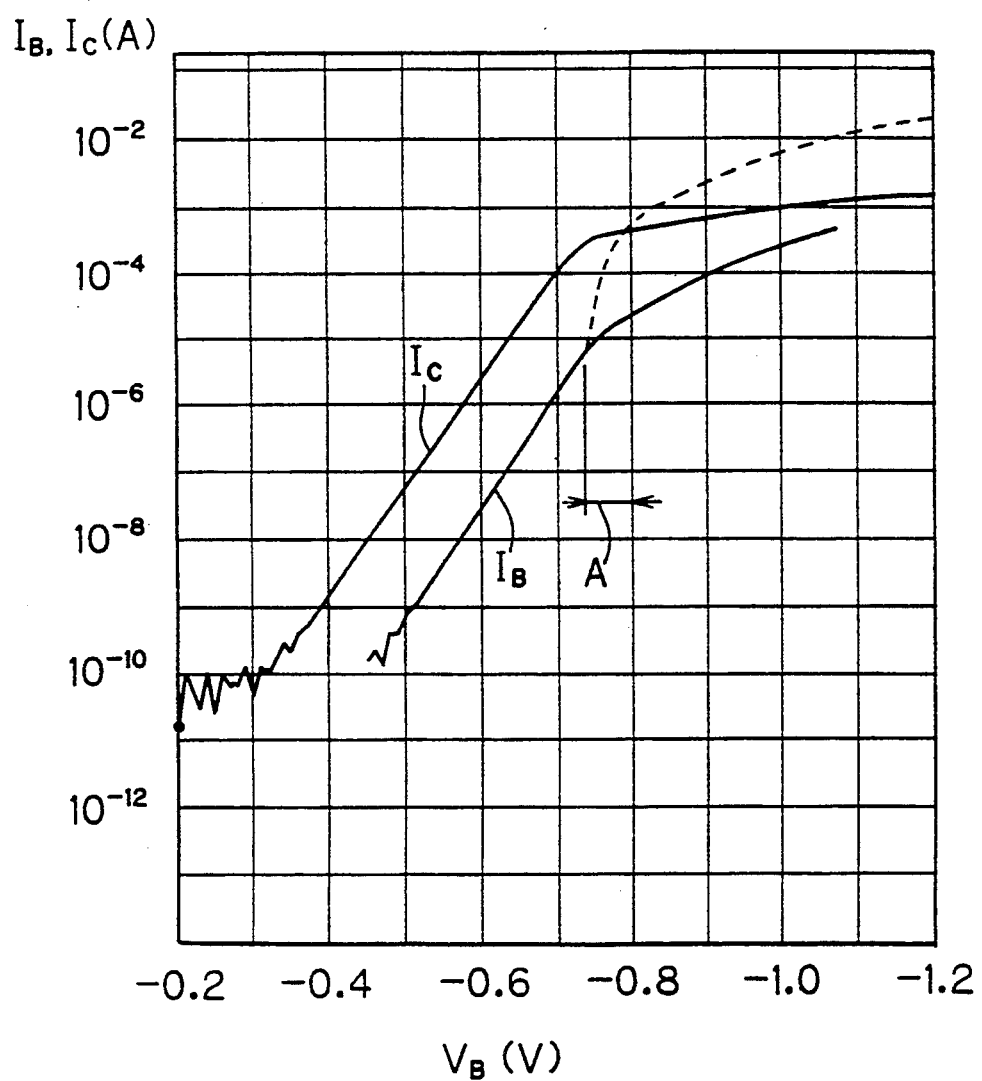
FIG. 15 is a graph showing characteristics of a base current $I_B$ and a collector current $I_C$.

FIG. 15 is a graph of Gummel Plot. As a base-emitter voltage $V_{BE}$ of the PNP transistor is increased, voltage drop by the collector resistance causes a base-emitter potential to be in the forward direction. As a result, the parasitic transistor 102 of FIG. 13 operates, and a base current $I_B$ is increased rapidly (as shown by the broken curve of FIG. 15 in the region A). On the other hand, a collector current $I_C$ is not increased largely, thereby an amplification factor $h_{FE}$ being decreased.

Figure 16:
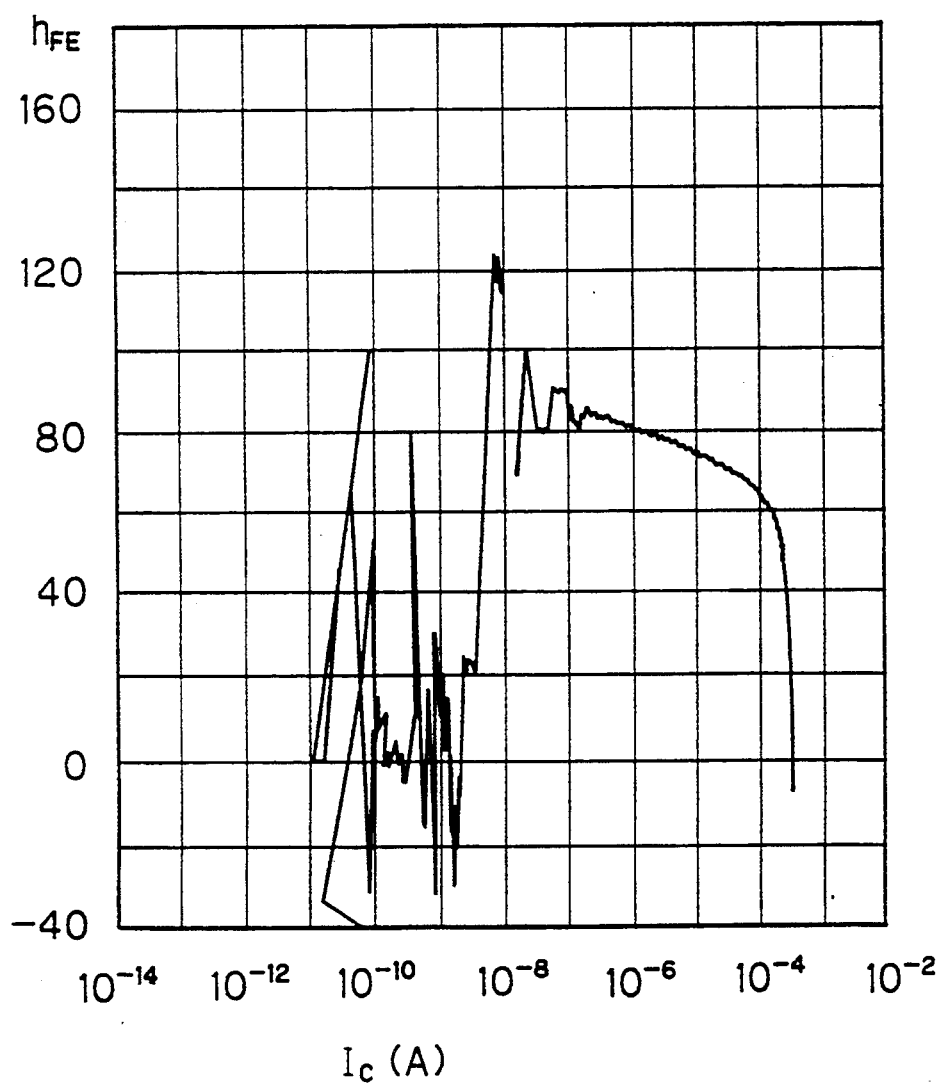
FIG. 16 is a graph showing characteristics of an amplification factor $h_{FE}$.

FIG. 16 is a graph showing relation between the amplification factor $h_{FE}$ and the collector current $I_C$. It is found that the amplification factor $h_{FE}$ is decreased rapidly at the collector current $I_C$ of more than $10^{-4}$ A (0.1 mA).

Figure 17:
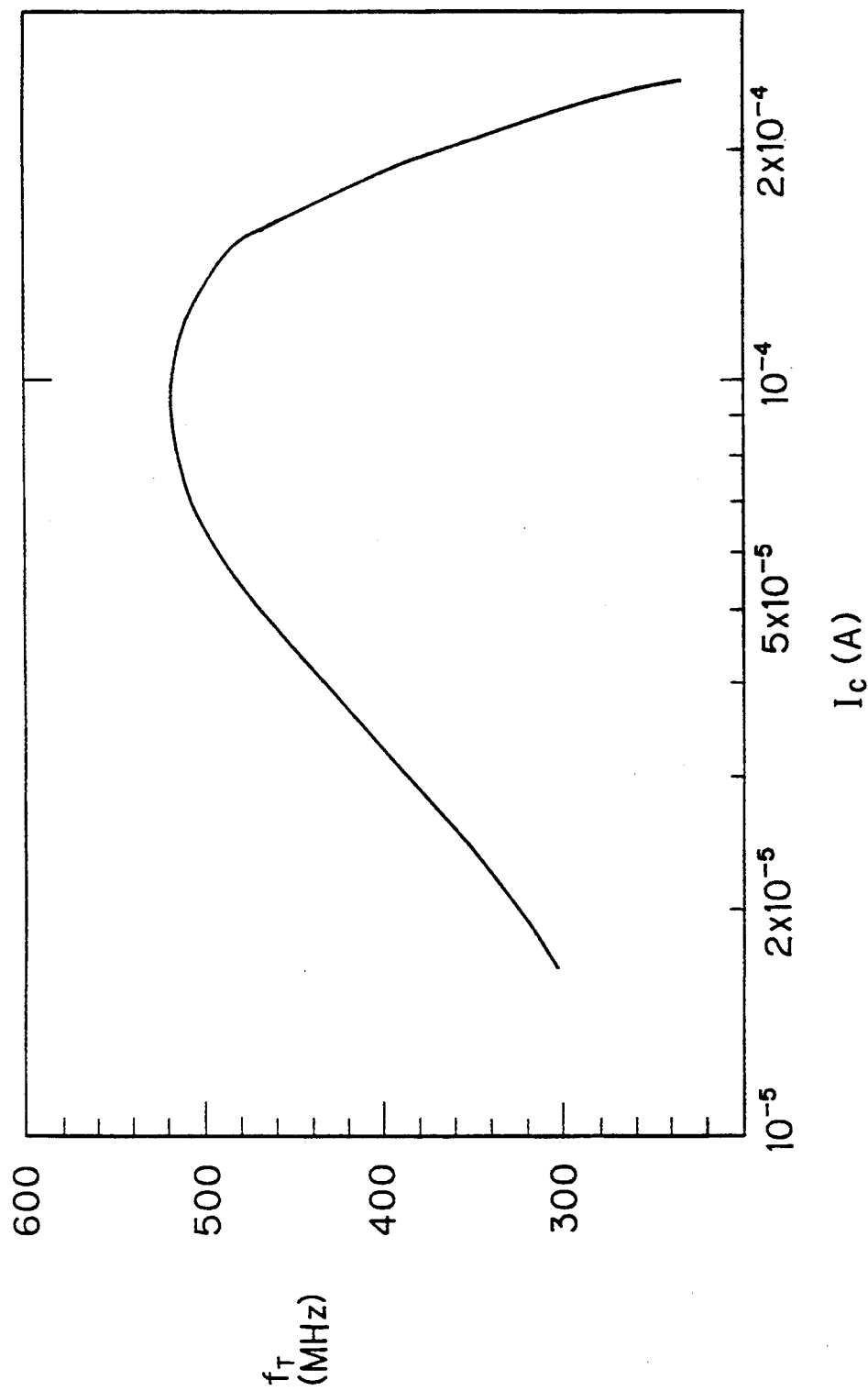
FIG. 17 is a graph showing characteristics of a cut-off frequency $f_T$.

Such decrease in the amplification factor causes decrease in cut-off frequency $f_T$. As shown in FIG. 17, the cut-off frequency $f_T$ is decreased rapidly at the collector current $I_C$ of more than $10^{-4}$ A (0.1 mA).

In the present invention, since the collector resistance is decreased, the operation of the parasitic transistor 102 is restrained. Accordingly, neither the rapid increase in the base current $I_B$ shown by the solid curve of FIG. 15 in the region A nor the rapid decrease in the amplification factor $h_{FE}$ and the cut-off frequency $f_T$ are generated.

In the present invention, since the NPN and PNP transistors 100 and 101a are insulated from each other by the isolation trench 7, the n+ type buried layer 2a may be formed in contact with the n type buried layer 2b. The n+ type buried layer 2a can be formed without a patterning mask, that is, in a self-aligned manner.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a complementary bipolar transistor, comprising the steps of:
   selectively performing ion implantation on one major surface of a p− type silicon substrate to form an n type first buried layer having a thickness;
   selectively performing ion implantation on said one major surface to form an n+ type second buried layer having a thickness which is smaller than the thickness of the first buried layer, said second buried layer being deposited complementarily to said first buried layer on said one major surface;
   selectively performing ion implantation on said first buried layer to form a p+ type third buried layer;
   forming an n− type impurity region by epitaxial growth on said first and third buried layers and on said second buried layer;
   forming an insulative trench extending from the surface of said impurity region through to the vicinity of said substrate for dividing said impurity region into a first active region including said third buried layer and a second active region other than the first active region;
   forming a PNP transistor in said first active region; and
   forming an NPN transistor in said second active region;
   wherein during said ion implantation to form said first buried layer, ions are implanted through a mask film which is placed on said p− type silicon substrate and which includes a selectively formed opening;
   said method of manufacturing a complementary bipolar transistor further comprising the step of forming an oxide film above said first buried layer by oxidizing said p− type silicon substrate while leaving said mask film where placed on said p− type silicon substrate, said oxidizing of said p− type silicon substrate being performed after said ion implantation to form said first buried layer but before said ion implantation to form said second buried layer, and
   wherein ions are implanted using said oxide film as a mask during said ion implantation to form said second buried layer.

2. A method of manufacturing a complementary bipolar transistor as defined in claim 1, wherein said PNP transistor is a vertical transistor.

3. A method of manufacturing a complementary bipolar transistor as defined in claim 1, wherein said ion implantation for forming said first buried layer employs phosphorus ions at a dose in the order of $10^{13}$ to $10^{14}$ cm$^{-2}$.

4. A method of manufacturing a complementary bipolar transistor as defined in claim 1, wherein said ion implantation for forming said third buried layer employs boron ions at a dose in the order of $10^{14}$ cm$^{-2}$.

5. A method of manufacturing a semiconductor device, comprising the steps of:
   selectively introducing impurities to one major surface of a first conductivity type semiconductor substrate to form a second conductivity type first buried layer having an impurity concentration and a thickness;
   selectively introducing impurities to said one major surface to form a second conductivity type second buried layer having an impurity concentration which is higher than the impurity concentration of the first buried layer and a thickness which is smaller than the thickness of the first buried layer, said second buried layer being deposited complementary to and in contact with said first buried layer on said one major surface;
   selectively introducing impurities onto said first buried layer to form a first conductivity type third buried layer;
   forming a second conductivity type region by epitaxial growth on said first and third buried layers and on said second buried layer;
   forming an insulating trench extending from the surface of said second conductivity type region through to the vicinity of said substrate for dividing said second conductivity type region into a first active region including said third buried layer and a second active region other than the first active region;

forming a first semiconductor device in said first active region; and forming a second semiconductor device in said second active region, the conductivity type of said second semiconductor device being inverse to that of said first semiconductor device.

6. A method of manufacturing a complementary bipolar transistor, comprising the steps of:

selectively performing ion implantation on one major surface of p⁻ type silicon substrate to form an n type first buried layer having a thickness;

selectively performing ion implantation on said one major surface to form an n⁺ type second buried layer having a thickness which is smaller than the thickness of the first buried layer, said second buried layer being deposited complementarily to and in contact with said first buried layer on said one major surface;

selectively performing ion implantation on said first buried layer to form a p⁺ type third buried layer;

forming an n⁻ type impurity region by epitaxial growth on said first and third buried layers and on said second buried layer;

forming an insulative trench extending from the surface of said impurity region through to the vicinity of said substrate for dividing said impurity region into a first active region including said third buried layer and a second active region other than the first active region;

forming a PNP transistor in said first active region; and forming an NPN transistor in said second active region.

7. A method of manufacturing complementary bipolar transistor as defined in claim 6, wherein said PNP transistor is a vertical transistor.

8. A method of manufacturing a complementary bipolar transistor as defined in claim 6, wherein said ion implantation for forming said first buried layer employs phosphorus ions at a dose in the order of $10^{13}$ to $10^{14}$ cm$^{-2}$.

9. A method of manufacturing a complementary bipolar transistor as defined in claim 6, wherein said ion implantation for forming said third buried layer employs boron ions at a dose in the order of $10^{14}$ cm$^{-2}$.

10. A method of manufacturing a complementary bipolar transistor as defined in claim 6, wherein during said ion implantation to form said first buried layer, ions are implanted through a mask film which is placed on said p⁻ type silicon substrate and which includes a selectively formed opening, said method of manufacturing a complementary bipolar transistor further comprising the step of forming an oxide film above said first buried layer by oxidizing said p⁻ type silicon substrate while leaving said mask film as it is placed on said p⁻ type silicon substrate, said oxidizing of said p⁻ type silicon substrate being performed after said ion implantation to form said first buried layer but before said ion implantation to form said second buried layer, and ions are implanted using said oxide film as a mask during said ion implantation to form said second buried layer.

* * * * *